United States Patent [19]

Araki et al.

[11] Patent Number: 4,949,308

[45] Date of Patent: Aug. 14, 1990

[54] STATIC RANDOM ACCESS MEMORY HAVING A FLASH CLEAR FUNCTION

[75] Inventors: Shigeo Araki; Hitoshi Taniguchi; Hiroyuki Suzuki; Takaaki Komatsu, all of Kanagawa, Japan

[73] Assignee: Sony Corporation, Tokyo, Japan

[21] Appl. No.: 271,619

[22] Filed: Nov. 15, 1988

[30] Foreign Application Priority Data

Nov. 17, 1987 [JP] Japan ............................... 62-290408

[51] Int. Cl.$^5$ ............................................ G11C 7/00

[52] U.S. Cl. ................................ 365/218; 365/230.03; 365/194; 365/227

[58] Field of Search ................... 365/194, 218, 230.03, 365/230.04, 227

[56] References Cited

U.S. PATENT DOCUMENTS

| | | | |
|---|---|---|---|
| 4,774,691 | 9/1988 | Hidaya | 365/203 X |
| 4,789,967 | 12/1988 | Liou et al. | 365/218 |
| 4,813,021 | 3/1989 | Kai et al. | 365/194 |

FOREIGN PATENT DOCUMENTS

| | | | |
|---|---|---|---|
| 0109069 | 5/1984 | European Pat. Off. | 365/222 |
| 0149043 | 11/1984 | European Pat. Off. | |
| 0189700 | 12/1985 | European Pat. Off. | |

OTHER PUBLICATIONS

Wada, T. et al, "A 34–ns 1–Mbit CMOS SRAM Using Triple Polysilicon", IEEE Journal of Solid-State Circuits, SC-22:5 (10/87), pp. 727–732.

*Primary Examiner*—Stuart N. Hecker
*Assistant Examiner*—Alfonso Garcia
*Attorney, Agent, or Firm*—Philip M. Shaw, Jr.

[57] ABSTRACT

The invention provides a static random access memory wherein the peak value of current flow therethrough upon flash-clearing is minimized. The static random access memory comprises a memory cell array which is divided into a plurality of memory cell groups which are driven at mutually different timings for flash-clearing by means of a plurality of delay circuits connected in cascade to which the flash-clearing signal is applied.

3 Claims, 3 Drawing Sheets

$\overline{Sc}$ $\overline{Sc1}$ $\overline{Sc2}$ $\overline{Sc3}$ $\overline{Sc4}$ $\overline{Sc15}$

DL1 DL2 DL3 DL4 DL5 DL15

DE0 DE1 DE2 DE3 DE4 DE15

M0 M1 M2 M3 M4 M15

STATIC RANDOM ACCESS MEMORY HAVING A FLASH CLEAR FUNCTION

BACKGROUND OF THE INVENTION

1. Field of the Invention

This invention relates to a static random access memory (hereinafter referred to as SRAM), and more particularly to an SRAM having a flash-clear function. Description of the Prior Art Some conventional SRAMs have a flash-clear function. When an SRAM has a flash-clear function, a data "0" is written into all of the memory cells of the SRAM at the same time when a control signal is applied to the SRAM from the outside. The flash-clear function is used to reset an SRAM or make initialization of an SRAM in preparation for testing.

FIG. 5 is a block diagram showing an exemplary SRAM having a flash-clear function. Referring to FIG. 5, the SRAM shown includes a memory cell array a and a flash-clearing decoder b. If a flash-clear control signal is received at the flash-clearing decoder b of the SRAM from the outside, a flash-clearing pull-down transistor (not shown) provided in the memory cell array a is driven to change the voltage level of one of the bit lines of each pair of bit lines B and $\overline{B}$ to the ground level. With the conventional SRAM shown in FIG. 5, flash-clearing is conducted all at once for the entire memory cell array a by way of the single decoder b.

The SRAM shown in FIG. 5 has the drawback that, since it includes only the one decoder b and flash-clearing is conducted all at once for the entire memory cell array a by way of the single decoder b, the magnitude of the electric current flow through the memory cell array and the decoder upon flash-clearing exhibits a very high peak value as seen in FIG. 6.

Since the storage capacity of such memory devices has increased remarkably in recent years and memory cell arrays are likely to increase in scale, if a large scale memory cell array is flash-cleared in the above described manner, then the current peak will be very high. Where the peak of current is high, naturally the level of the power supply line or the ground line will fluctuate so that electrical signal noises are produced. There is also the possibility that the wires in such a large scale chip may be melted to cause destruction of the internal structure of the chip or cause destruction of an appliance in which the memory device is used. Accordingly, such an excessively high peak current flow upon flash-clearing is an unignorable problem.

SUMMARY OF THE INVENTION

Accordingly, it is an object of the present invention to provide an SRAM wherein current flow upon flash-clearing thereof exhibits a low peak value.

In order to attain the object, according to the present invention, there is provided a static random access memory having a flash-clear function which comprises a memory cell array which is divided into a plurality of memory cell groups, a decoder provided for each of the memory cell groups for driving the memory cell group for flash-clearing, and means for controlling the decoders to operate at mutually different timings for flash-clearing.

With the static random access memory according to the present invention, the plurality of divided memory cell groups of the memory cell array are flash-cleared seriatim. Accordingly, the magnitude of peak current flow through the static random access memory upon flash-clearing can be minimized.

The above and other objects, features and advantages of the present invention will become apparent from the following description and the appended claims taken in conjunction with the accompanying drawings

DESCRIPTION OF THE PREFERRED EMBODIMENT

Figure 1:
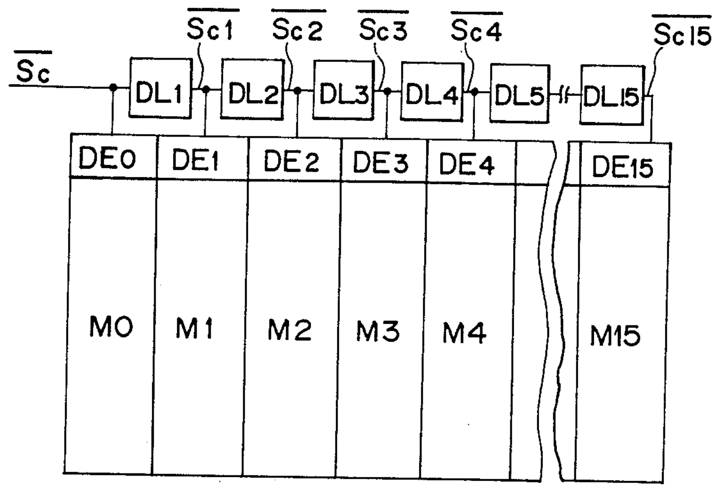
FIG. 1 is a block circuit diagram of an SRAM showing a preferred embodiment of the present invention.

Referring first to FIG. 1, an SRAM according to the invention is shown including a memory cell array which is divided into a total of 16 memory cell groups M0 to M15, and a total of 16 flash-clearing decoders DE0 to DE15 provided to the corresponding individual memory cell groups M0 to M15. Delay circuits DL1 to DL15 are connected in cascade, and the delay circuit DLI at the first stage receives an external control signal $\overline{Sc}$ and sends out an output signal $\overline{Sc}$1 to the flash-clearing decoder DE1. The delay circuit DL2 at the second stage receives the output signal $\overline{Sc}$1 of the delay circuit DLI and sends out an output signal $\overline{Sc}$2 to the flash-clearing decoder DL2. In this manner, the delay circuit DLI to DL15 successively delay the external control signal $\overline{Sc}$ and couple the thus delayed signals to the flash-clearing decoders DEI to DE15, respectively. It is to be noted that the external control signal $\overline{Sc}$ is applied directly to the decoder DE0.

Figure 2:
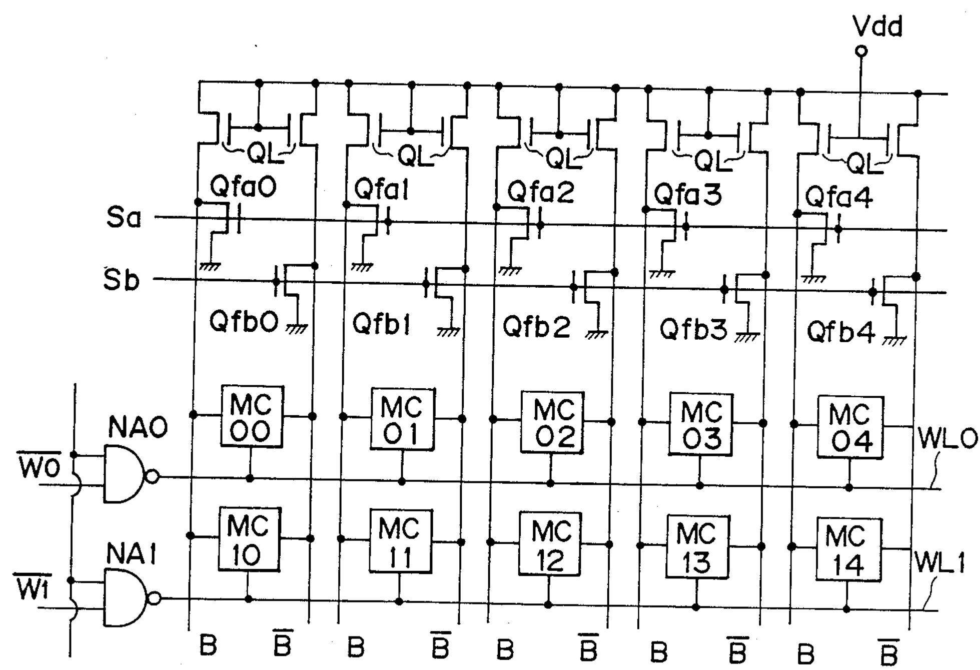
FIG. 2 is a detailed circuit diagram of a representative portion of the memory cell arrangement of the SRAM shown in FIG. 1.
Figure 3:
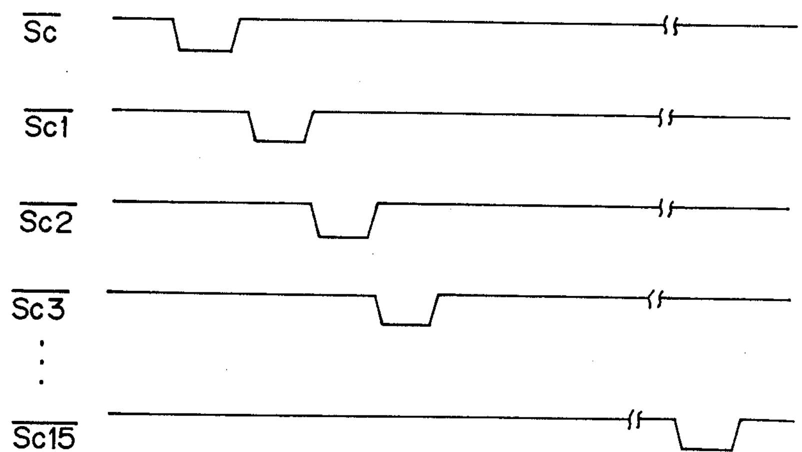
FIG. 3 is a timing chart illustrating input timings of a control signal to decoders of the SRAM shown in FIG. 1.

Referring now to FIG. 2, which shows only the arrangement of the memory cells, each of the memory cell groups MC00 to MC15 includes a plurality of pairs of load MOS transistors QL, and a plurality of flash-clearing pull-down MOS transistors Qfa0, Qfal, Qfa2, . . . and Qfb0, Qfb1, Qfb2, . . . . When a control signal $\overline{Sc}$ is received, each of the decoders DE0 to DE15 develops a control signal Sa of "1" and another control signal Sb of "0" to change the value of the voltage on a bit line B of the corresponding one of the memory cell M0 to M15 into a value representing "0" and change the value of the other bit line $\overline{B}$ into a voltage corresponding to a digital "1". Meanwhile, word lines WL0, WL1, WL2, . . . are all put into a selecting condition when flash-clearing is to be effected This can be realized, for example, by a circuit construction such that a word signal is applied to NAND gates NA, which are separately provided for each of the word lines, and a signal "0" is applied to the other input terminals of the NAND gates NA, that is, the input terminals other than those at which the NAND gates NA receive the word signal Accordingly, if one of the decoders DE0 to DE15 receives a control signal $\overline{Sc0}$, $\overline{Sc1}$, . . . or $\overline{Sc15}$, then all of the memory cells MC within a corresponding one of the memory cell groups M0 to M15 are flash-cleared.

Figure 4:
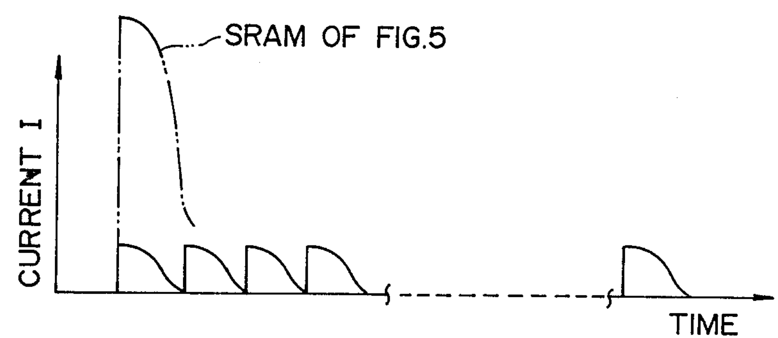
FIG. 4 is a graph showing a waveform of the electric current upon flash-clearing of the SRAM shown in FIG. 1.
Figure 5:
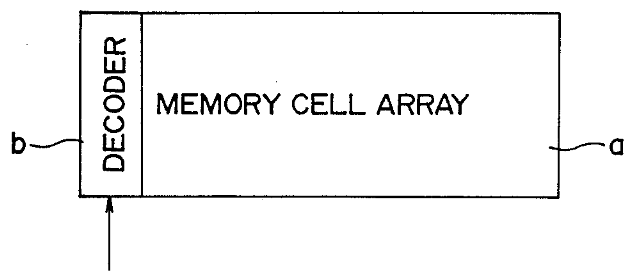
FIG. 5 is a block circuit diagram showing a conventional SRAM.
Figure 6:
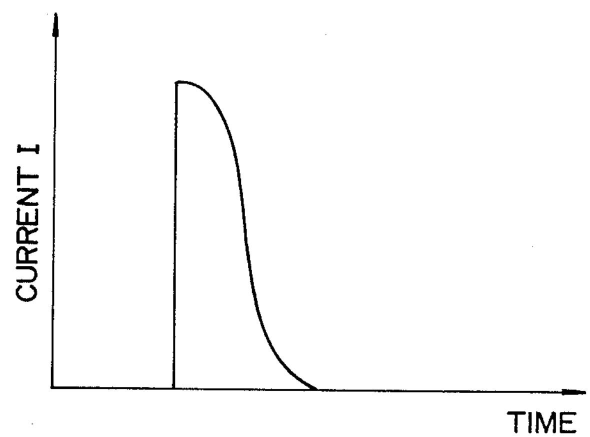
FIG. 6 is a graph showing a waveform of electric current upon flash-clearing of the conventional SRAM shown in FIG. 5, illustrating a drawback of the conventional SRAM.

The control signals Sc0, $\overline{Sc1}$,$\overline{Sc2}$, . . . to be applied to the flash-clearing decoders DE0, DE1, DE2, . . . and DE15, respectively are delayed with respect to each other by the action of the delay circuits DL1, DL2, and DL15. Accordingly, flash-clearing takes place at different timings at the memory cell groups M0, M1, M2, . . . and M15 in this order. Accordingly, flow of current upon flash-clearing vary, as indicated by solid lines in FIG. 4, and accordingly the peak value of the current flow through the SRAM can be reduced remarkably compared to the peak of the current flow through the SRAM 5 shown in FIG. 5 which is indicated by a two-dot chain line in FIG. 4.

It is to be noted that while in the embodiment described above the memory cell array is divided into a plurality of memory cell groups by dividing all columns of the memory cell array into a plurality of column groups, it may otherwise be divided into a plurality of memory cell groups by dividing all rows of the memory cell array into a plurality of row groups. In the case where the memory cell array is divided in rows, a word signal is applied to NAND gates NA, which are separately provided for each of the word lines, and a signal "0" is applied to the other input terminals of the NAND gates NA, that is, the input terminals other than those at which the NAND gates NA receive the word signal, at similarly differentiated timings to the divided rows of the memory cell array. Otherwise, the memory cell array may be divided into columns and also in rows.

Although the present invention has been shown and described with respect to preferred embodiments, various changes and modifications which are obvious to a person skilled in the art to which the invention pertains are deemed to lie within the spirit and scope of the invention.

What is claimed is:

1. A static random access memory having a flash clear function which is activated by a flash clear command signal on a control line, comprising:

a memory cell array which is divided into a plurality of memory cell groups;

a plurality of decoders, each of which is associated with a different one of said memory cell groups and each of which drives its associated memory cell group when it receives a flash clear command signal; and means for controlling the decoders to operate sequentially for flash-clearing, by sequentially supplying the flash clear command signal to each of the decoders.

2. A static random access memory having a flash-clear function which is activated by a flash clear command signal on a control line, comprising:

a memory cell array which is divided into a plurality of memory cell groups; and a plurality of decoders each of which is associated with a different one of each of said memory c ®11 groups, and each of which drives its associated memory cell group for flash clearing is response to a flash clear command signal; and means for controlling the decoders to operate sequentially for flash clearing, by sequentially supplying the flash clear command signal to each of the decoders, wherein the means for controlling includes a plurality of delay circuits, wherein the number of delay circuits corresponds to the number of said memory cell groups, minus one.

3. A static random access memory having a flash clear function, as recited in claims 1 or 2, wherein:

the decoders and memory cell groups include a zeroth decoder and a zeroth memory cell group connected to the zeroth decoder, a first decoder and a first memory cell group connected to the first decoder, a second decoder and a second memory cell group connected to the second decoder, etc., an Nth decoder and an Nth memory cell group connected to the Nth decoder, where N is a predetermined integer nuuber, the means for controlling the decoders includes a plurality of signal delay circuits, connected in cascade with a first one of the delay circuits being coupled to the control line and receiving a command signal, which includes the flash clear command, from the control line and wherein the output from a previous one of the delay circuits is connected to a subsequent one of the delay circuits and to an associated one of the decoders, and wherein, the output of the first delay circuit is connected to the first decoder, the output of a second delay circuit is connected to the second decoder, etc., and the output of the Nth delay circuit is connected to the Nth decoder.

* * * * *